United States Patent [19]
Atherton et al.

[11] Patent Number: 5,336,991
[45] Date of Patent: Aug. 9, 1994

[54] APPARATUS AND METHOD FOR MEASURING ELECTRICAL ENERGY AND QUADERGY AND FOR PERFORMING LINE FREQUENCY COMPENSATION

[75] Inventors: Kenneth W. Atherton, Saco, Me.; Gerard Chevalier, Quebec City, Canada; Jokin Galletero, Bilbao, Spain; Donald F. Bullock, Madbury, N.H.; Curtis W. Crittenden, Dover, N.H.; David D. Elmore, Somersworth, N.H.; Warren R. Germer, Dover, N.H.

[73] Assignee: General Electric Company, Schenectady, N.Y.

[21] Appl. No.: 49,039

[22] Filed: Apr. 16, 1993

[51] Int. Cl.$^5$ ............................................. G01K 1/04
[52] U.S. Cl. ................................... 324/142; 324/141; 324/140 R; 324/126; 324/127
[58] Field of Search ............................. 324/140–142, 324/126–127

[56] References Cited

U.S. PATENT DOCUMENTS

| | | | |
|---|---|---|---|
| 5,229,713 | 7/1993 | Bullock et al. | 324/142 |
| 5,298,854 | 3/1994 | McEachern | 324/142 |

Primary Examiner—Walter E. Snow
Assistant Examiner—Barry C. Bowser
Attorney, Agent, or Firm—Bell, Seltzer, Park & Gibson

[57] ABSTRACT

An apparatus and method for measuring electrical energy and quadergy and for performing line frequency compensation includes a compensation integrated circuit for adjusting the determined reactive load quadergy, based on variations between the actual line frequency and the rated line frequency of the meter. Reactive load quadergy is determined by phase-shifting the line voltage by a fixed time interval, based on the rated line frequency of the meter. The determined reactive load quadergy is adjusted to compensate for variations in line frequency. Because the determined reactive load quadergy is output by an electric meter as a continuous pulse train, adjustment to the determined reactive load quadergy is performed by adding or subtracting state changes from the pulse train and then registering the adjusted reactive load quadergy.

25 Claims, 5 Drawing Sheets

APPARATUS AND METHOD FOR MEASURING ELECTRICAL ENERGY AND QUADERGY AND FOR PERFORMING LINE FREQUENCY COMPENSATION

FIELD OF THE INVENTION

The present invention relates to electrical energy measurement, and more particularly to apparatus and methods for measuring electrical energy and quadergy.

BACKGROUND OF THE INVENTION

In the distribution of electrical energy, electric utility companies have typically found it desirable to not only measure real load energy as watthours delivered to a user, but also, reactive load quadergy as varhours (or reactive volt-amperehours), apparent power and power factor (cos $\theta$). By measuring both watthours and varhours, electric utilities can more accurately apportion the costs of supplying energy to those customers who demand the most from the power delivery network.

In the past, the measurement of varhours was either accomplished by using a second meter in conjunction with a conventional watthour meter or, more recently, a meter with the built-in capability of measuring both watthours and varhours, such as a General Electric ® Phase3 ™ Electronic Polyphase Meter. In either case, however, the technique for measuring varhours has typically required the phase shifting of the measured line voltage by 90° (¼ cycle) or cross-phasing of line voltages and currents. Voltage phase shifts of 60° result in a different measurement generally called Qhours. Qhours are a reactive measurement that evolved from the fact that a 60° phase shift could be readily accomplished by cross-phasing the meter voltage connections to a polyphase circuit at the meter, thus eliminating the need for phase shifting transformers as is required for the measurement of varhours.

However, providing a 90° phase shift, which typically involves delaying the line voltage by a fixed time interval (5 ms for a 50 Hz rated meter), will cause errors in the measured varhours if the line frequency deviates from the rated frequency of the meter. These errors are unlikely to be appreciable in the United States and Western Europe, but in many other countries, electric utility companies have greater difficulty guaranteeing that the line frequency will be maintained within a predetermined range about the rated line frequency.

Moreover, since many of these countries also have strict regulations limiting the variations in acceptable error for meters of various classes, it is necessary that meters be capable of detecting line frequency variations and correcting measured varhours, to more accurately reflect the actual quadergy. For example, the international standard set by the International Electrotechnical Commission (IEC), section 1030, applicable to meter accuracy classes 2 and 3, requires that for a reactive power factor (sin ) of either 0.5 or 1.0, the variation in error must be $\leq 2.5\%$, given a frequency variation of $\pm 5\%$.

Accordingly, there is a substantial international need for meters capable of accurately measuring varhours even when line frequency variations are appreciable.

SUMMARY OF THE INVENTION

It is therefore an object of the present invention to provide an apparatus and method for accurately measuring electrical energy and other related quantities.

It is another object of the present invention to provide an apparatus and method for accurately measuring electrical quadergy, notwithstanding variations in line frequency.

It is a further object of the present invention to provide an apparatus and method for measuring electrical energy that provides for real-time correction to errors in the quadergy and apparent power, caused by variations in line frequency.

These and other objects are provided, according to the present invention, by an apparatus and method for measuring the integral with respect to time of the active power and the reactive power and for performing line frequency compensation so that the measured quadergy more accurately reflects the net quadergy. In particular, the apparatus of the present invention includes means for sensing a line voltage, a load current and a line frequency, during an energy measurement time interval. Real load energy (watthours) and reactive load quadergy (varhours and/or Q-hours) are also determined during the energy measurement time interval. Compensation means is also provided, for adjusting the determined reactive load quadergy, based on deviations between the sensed line frequency and the rated line frequency.

As will be understood by those skilled in the art, one technique for determining reactive load quadergy from a sensed line voltage and a sensed load current is to quadrature phase shift the sensed line voltage by 90° (¼ cycle) in order to obtain varhours, or phase shift by 60° (1/6 cycle) to obtain Q-hours. Phase shifting is typically performed by delaying the sensed line voltage by a fixed time interval, typically 5 ms for a 50 Hz rated system. However, if the sensed line frequency is not equal to the rated frequency, the fixed time delay will cause inaccuracies in the determined reactive load quadergy.

The compensation means preferably comprises means for generating a series of count pulses at a rate proportional to the rated line frequency, which is typically 50 or 60 Hz for international and United States power delivery systems, respectively. The count pulses are preferably provided at a rate of 1/12th the rate of a highly accurate and stable timing oscillator, having a 7.3728 Mhz crystal. This count rate insures that a predetermined integer number of count pulses will occur during an interval proportional to the period of one cycle of the rated line frequency (50 or 60 Hz). Means is also provided for determining the actual number of count pulses that occur during an interval proportional to the period of one cycle of the sensed line frequency. By taking the difference between the actual and predetermined number of count pulses, the difference between the sensed line frequency and the rated line frequency can be determined on a cycle-by-cycle basis.

The compensation means also comprises means for determining a moving average difference between the sensed line frequency and the rated line frequency, based upon the number of actual count pulses determined during an energy measurement time interval and the number of actual count pulses determined during preceding energy measurement time intervals. Preferably, the moving average difference is based on a total of 8–32 differences. As will be understood by one skilled in the art, the larger the number, the less robust the compensating means will be at detecting relatively short duration variations in the line frequency. However, if the number is too small, the compensation means will perform unnecessarily frequent and inconsequential adjustments to the determined quadergy, which may be below the resolution of the hardware used to implement the compensation technique. Because the moving average difference between the sensed line frequency and rated line frequency is updated for each set of determined count pulses, real-time frequency compensation is achieved.

Compensation factor determining means is also provided for generating a compensation factor, based on the moving average difference. Further, means for combining the compensation factor with the determined real load energy is provided for generating a compensation reactive load quadergy. The magnitude of the compensation reactive load quadergy is directly proportional to the magnitude of the difference between the sensed line frequency and the rated line frequency. The compensation reactive load quadergy is combined with the corresponding determined reactive load quadergy to thereby generate an adjusted reactive load quadergy, which more accurately reflects the actual reactive load quadergy. Finally, register means is provided for combining the adjusted reactive load quadergy and the determined real load energy to thereby determine the total energy and quadergy, during a measurement period including the energy measurement time interval.

In another embodiment, frequency compensation and adjustment of the determined reactive load quadergy is performed during a compensation measurement time interval containing a plurality of consecutive energy measurement time intervals. Although this embodiment maybe less accurate than the real-time approach described above, it maybe simpler to implement. In this embodiment, the compensation factor determining means comprises means for determining a difference between the sensed line frequency and the rated line frequency during consecutive energy measurement time intervals in the compensation measurement time interval. Means for determining an average difference between the sensed line frequency and the rated line frequency is also provided. However, the average difference is determined only once for each compensation measurement time interval, instead of being determined in real-time for each energy measurement time interval.

The embodiments of the present invention may be implemented with electronic hardware including an electronic meter integrated circuit, a frequency compensation integrated circuit and a register integrated circuit. In this implementation, the electronic meter integrated circuit is responsive to a sensed line voltage and a sensed load current and generates a plurality of output signals including watthour pulse train signals, varhour pulse train signals and a sensed line frequency signal. The frequency compensation integrated circuit, which is responsive to the output signals from the electronic meter integrated circuit, generates compensated varhour pulse train signals, based on differences between the sensed line frequency and the rated line frequency. A register integrated circuit, responsive to signals generated by the electronic meter integrated circuit and the compensation integrated circuit, is also provided for determining a load energy and quadergy, corresponding to the sensed line voltage and the sensed load current.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
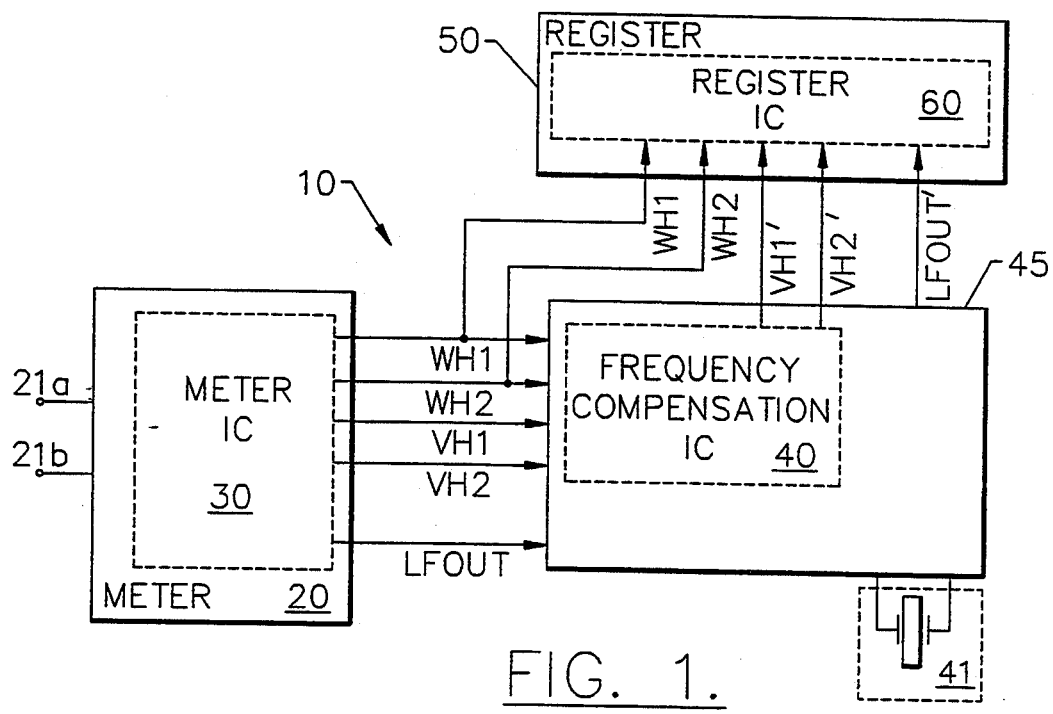
FIG. 1 is a block diagram of an apparatus for performing line frequency compensation according to the present invention.

Referring now to FIG. 1, a block diagram of an apparatus for measuring electrical energy and for performing line frequency compensation 10 is shown. At the front end is a meter 20 for sensing a line voltage and a load current at inputs 21a and 21b, respectively, and for sensing a line frequency therefrom. The meter 20 can be either a single or multiple phase meter. Preferably, a General Electric ® Phase3 ™ Electronic Polyphase Meter is used for sensing the inputs and for generating watthour and varhour pulse train signals, from which quantities such as real load energy and reactive load quadergy as well as energy direction and lead/lag power factor can be derived. The operation of this meter, having an electronic meter integrated circuit 30 (meter IC) contained therein, is described in U.S. Pat. No. 5,059,896, to Germer et al., issued Oct. 22, 1991, and assigned to the assignee of the present invention: the General Electric Company, the disclosure of which is hereby incorporated herein by reference.

The primary function of the meter 20 and meter IC 30 is to measure active power and reactive power from the meter's current and voltage inputs 21a and 21b, and then separately integrate each with respect to time and provide output pulse trains indicative of quantity (real energy and quadergy), direction and power factor, for each measurement. The meter IC 30 is preferably designed to provide a plurality of watthour metering pulses at outputs WH1 and WH2. Each change in state of the pulse trains (WH2, WH1) represents a quantum (K) of real volt-ampere hours. Alternatively, the meter 20 can be adapted to perform one or more of the functions described herein, such as by measuring variations in line frequency directly using hardware to measure the time interval between the zero crossover points of the sensed line voltage and/or the sensed load current.

The meter IC 30 also provides a plurality of reactive (varhour) metering pulses generated at outputs VH1 and VH2, preferably having the same scale value as WH1 and WH2. Again, each change in state of the pulse trains (VH2, VH1) represents K reactive volt-ampere hours. One technique for determining VH1 and VH2 from the sensed line voltage and the sensed load current is to quadrature phase shift the sensed line voltage by 90° (¼ cycle). Phase shifting is typically performed by delaying the sensed line voltage by a fixed time interval, typically 5 ms for a 50 Hz rated system. However, if the sensed line frequency is not equal to the rated frequency, the fixed time delay will cause inaccuracies in the VH1, VH2 pulse trains.

The sequence of states of the pulse trains (VH2, VH1) indicates whether a leading or lagging power factor is present. As will be understood by one skilled in the art, a leading power factor usually represents a net capacitive load and a lagging power factor usually represents a net inductive load. Preferably, the meter IC 30 can also be switched to measure Q-hours instead of varhours to thereby generate a plurality of Q-hour metering pulses analogous to VH1, VH2. The meter IC 30 also provides a signal proportional to sensed line frequency (LFOUT), which is used in performing frequency compensation when LFOUT # LFRATED (the rated line frequency for the meter 20).

A frequency compensation integrated circuit (FCIC) 40 is also provided for generating compensated varhour metering pulses VH1' and VH2' in real-time. The reference to real-time indicates that inaccuracies in the varhour metering pulse trains (VH2, VH1) are determined on a continuous basis for each energy measurement time interval. The determined inaccuracies are accumulated during consecutive energy measurement time intervals and are either output to or withheld from the pulse trains (VH2', VH1'), when the accumulated inaccuracies represent K worth of reactive volt-ampere hours. Batch processing, in contrast to real-time processing, means that the varhour metering pulses are adjusted less frequently, at the end of a compensation measurement time interval comprising a plurality of energy measurement time intervals. Operations for performing frequency compensation are preferably implemented using a general purpose microcontroller 45 such as an 80C51, available from the Intel Corporation. However, it will be understood by those having skill in the art that general purpose hardware can also be used and that one or more aspects of the present invention can be incorporated within meter 20.

Still referring to FIG. 1, an electronic register 50 including a register IC 60 is electrically connected to the FCIC 40 and the meter IC 30. In particular, the register IC 60 performs the function of recording the watthour and compensated varhour state changes generated by the meter 20 and microcontroller 45, respectively. The register 50 may also display total energy and quadergy and perform other well known functions.

Figure 2A:
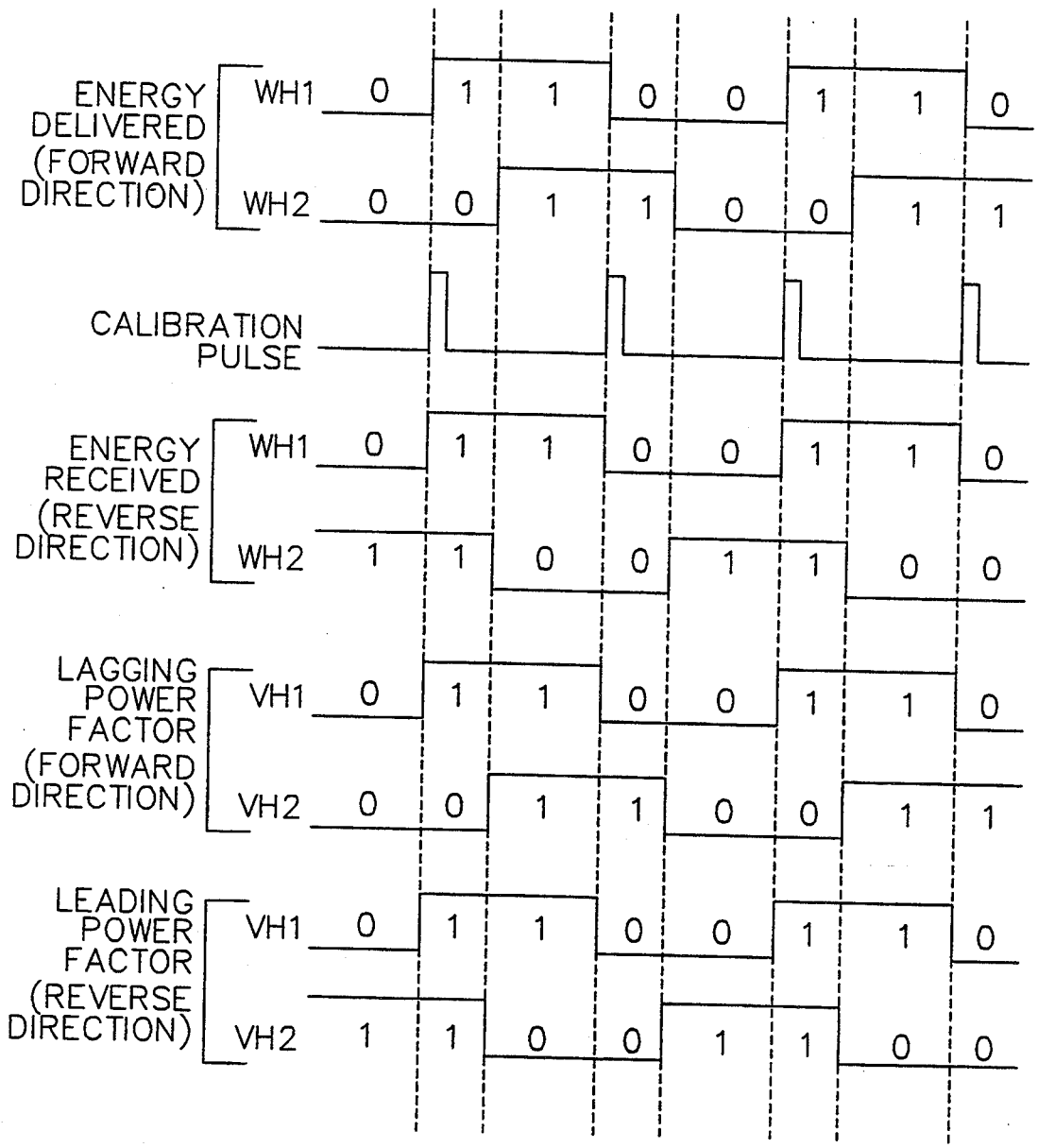
FIG. 2a is a timing diagram of forward and reverse direction metering pulse trains for watthours and varhours.

Referring now to FIG. 2a, a diagram of watthour and varhour metering pulse trains for outputs (WH2, WH1) and (VH2, VH1), respectively, is provided. The sequence of the state changes of (WH2, WH1) indicates the direction of energy transfer. With respect to the VH1 and VH2 pulses trains, however, the sequence of the state changes indicates whether a lagging (forward direction) or leading (reverse direction) power factor is present. FIG. 2a also shows the presence of a calibration pulse train which is triggered every time pulse train WH1 changes value. The calibration pulse rate is typically twelve (12) times the disk revolution rate of an equivalent contemporary ANSI electro-mechanical meter.

Figure 2B:
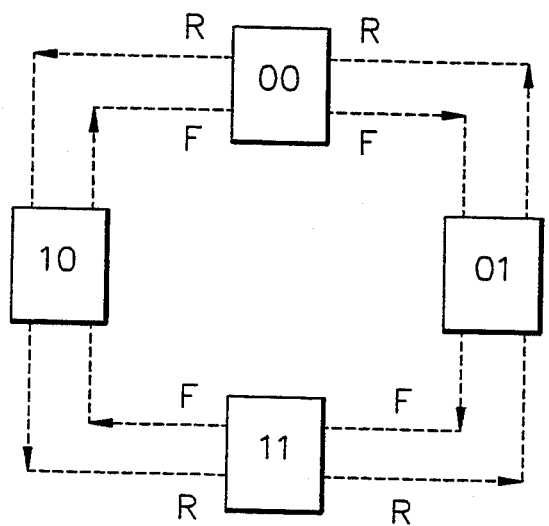
FIG. 2b is a state diagram for watthour/varhour state changes, indicating both forward direction (clockwise) and reverse direction (counterclockwise) changes in state.

Referring now to FIG. 2b, a state diagram for the watthour pulses (WH2, WH1) and varhour pulses (VH2, VH1) shown by FIG. 2a is provided. In particular, if watthours are being delivered to the load, the sequence of (WH2, WH1) will be {00-01-11-10-00-01- . . . } in the clockwise or forward (F) direction around the state diagram. If, instead, watthours are being received from the load, the sequence will be {00-10-11-01-00-10- . . . } in the counterclockwise or reverse (R) direction. Similarly, if a net inductive load is present, indicating a lagging power factor, the state sequence of (VH2, VH1) will be {00-01-11-10-00-01- . . . } in the clockwise or forward (F) direction around the state diagram. If the load is net capacitive, however, the state sequence will be {00-10-11-01-00-10- . . . } in the counterclockwise or reverse (R) direction.

Compensation to include upward adjustments to the (VH2, VH1) pulse trains to thereby generate (VH2', VH1') is performed by adding a state change to the (VH2, VH1) pulse train in either the forward or reverse direction, depending of whether the load is net inductive or capacitive, respectively. For example, if it is determined that an additional K worth of reactive volt-ampere hours needs to be added to the (VH2, VH1) pulse train in order to compensate for a change in the line frequency, then a lagging (VH2, VH1) pulse train of {01-11-10-00-01-11- . . . } for a given time interval would be adjusted by adding a state change in the forward sequence (positive) direction: {01-11-10-00-01-11-10- . . . }. For a net capacitive load, however, the addition of K worth of reactive volt-ampere hours would result in a change in (VH2, VH1) from {01-00-10-11-01-00- . . . } to {01-00-10-11-01-00-10- . . . } in the reverse sequence (negative) direction. Compensation to include downward adjustments to the (VH2, VH1) pulse trains to thereby generate (VH2', VH1'), however, is performed by eliminating a state change from the (VH2, VH1) pulse train rather than outputting a state change in the reverse direction.

As will be understood by one skilled in the art, because it is unlikely that substantial variations between the measured and actual reactive energy will occur for any given energy measurement time interval, adjustments to the (VH2, VH1) pulse trains, to include an additional or lesser number of varhour state changes, will occur on a relatively infrequent basis when compared to the number of determined varhour state changes in the (VH2, VH1) pulse train. In fact, for a given energy measurement time interval, only fractional adjustments will typically need to be made. However, these fractional adjustments will be accumulated during consecutive energy measurement time intervals and will only affect the (VH2, VH1) pulse train when a threshold K worth of reactive volt-ampere hours has been recognized.

Figure 2C:
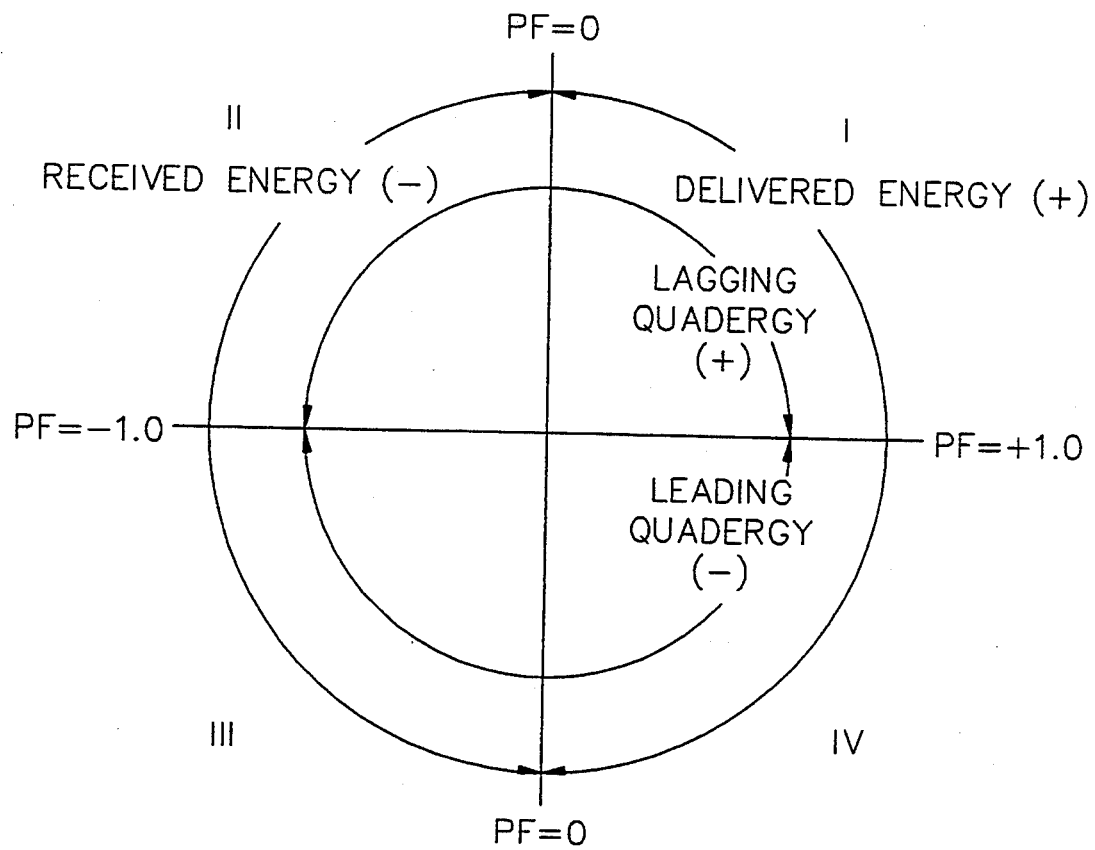
FIG. 2c is a graphical representation of the operating range of a meter showing both forward and reverse direction energy transfer and leading and lagging power factor.

Referring now to FIG. 2c, a graphical representation of the operating range of the meter 20 is shown. In particular, a power factor in quadrants II and III indicates that energy is being received from the load ($-1 \leq PF < 0$). A power factor in quadrants I and II indicates that the quadergy is of a lagging nature ($-1 \leq PF \leq 1$); or in quadrants III and IV, the quadergy is of a leading nature ($-1 \leq PF \leq 1$).

Figure 3:
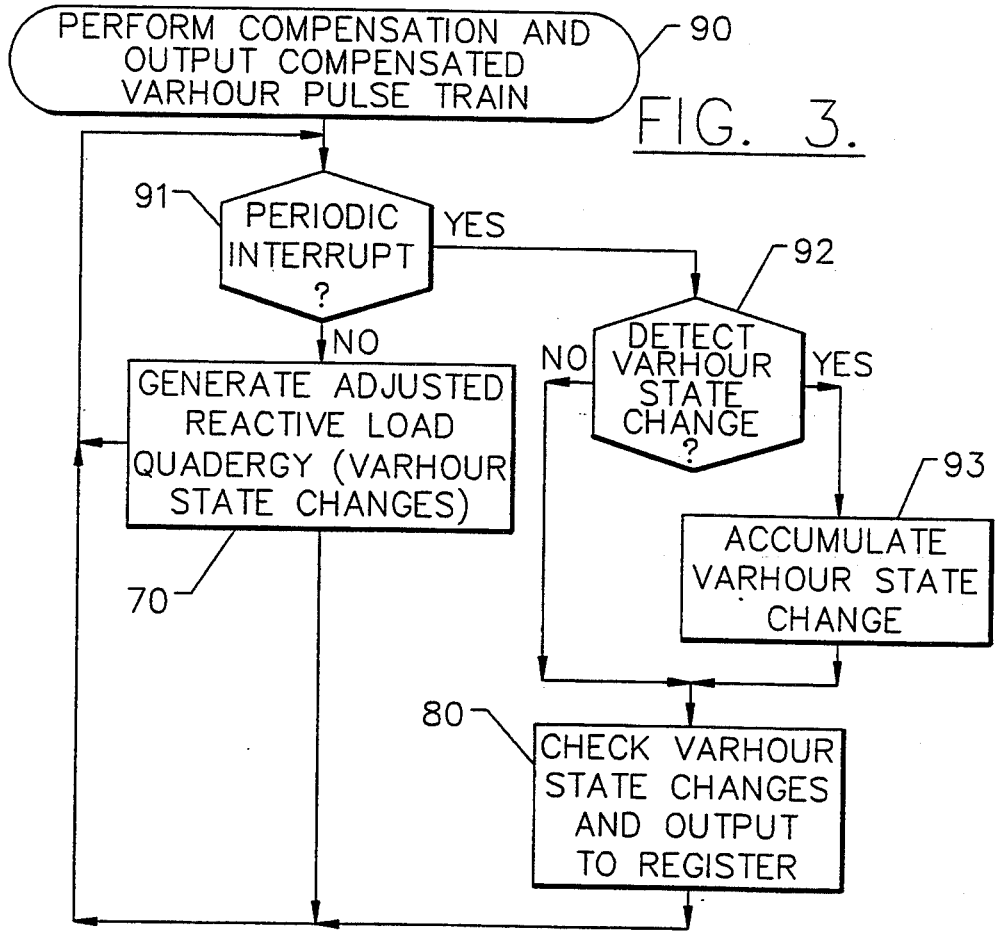
FIG. 3 is a block diagram illustrating operations for performing line frequency compensation according to the present invention.

Referring now to FIG. 3, operation 90 for performing compensation based on variations between sensed line frequency and the rated line frequency and for outputting a compensated varhour pulse train will be described. Operation 90 includes an operation for generating adjusted varhour state changes, Block 70, and an operation for checking varhour state changes and outputting them in the form of an adjusted pulse train (VH2', VH1') to the register 50, Block 80. To invoke the operation for checking varhour state changes, however, the occurrence of a periodic interrupt is required, Block 91. Once invoked, the presence of newly occurring varhour state changes is checked, Block 91, and then accumulated, Block 93, if present. As will be understood by one skilled in the art, the occurrence of the interrupt temporarily suspends the operation for generating adjusted varhour state changes, Block 70. Thus, when the operation for outputting any necessary varhour state changes has been completed, Block 80, the microcontroller 45 resumes the operation for generating adjusted varhour state changes where it left off.

Figure 4:
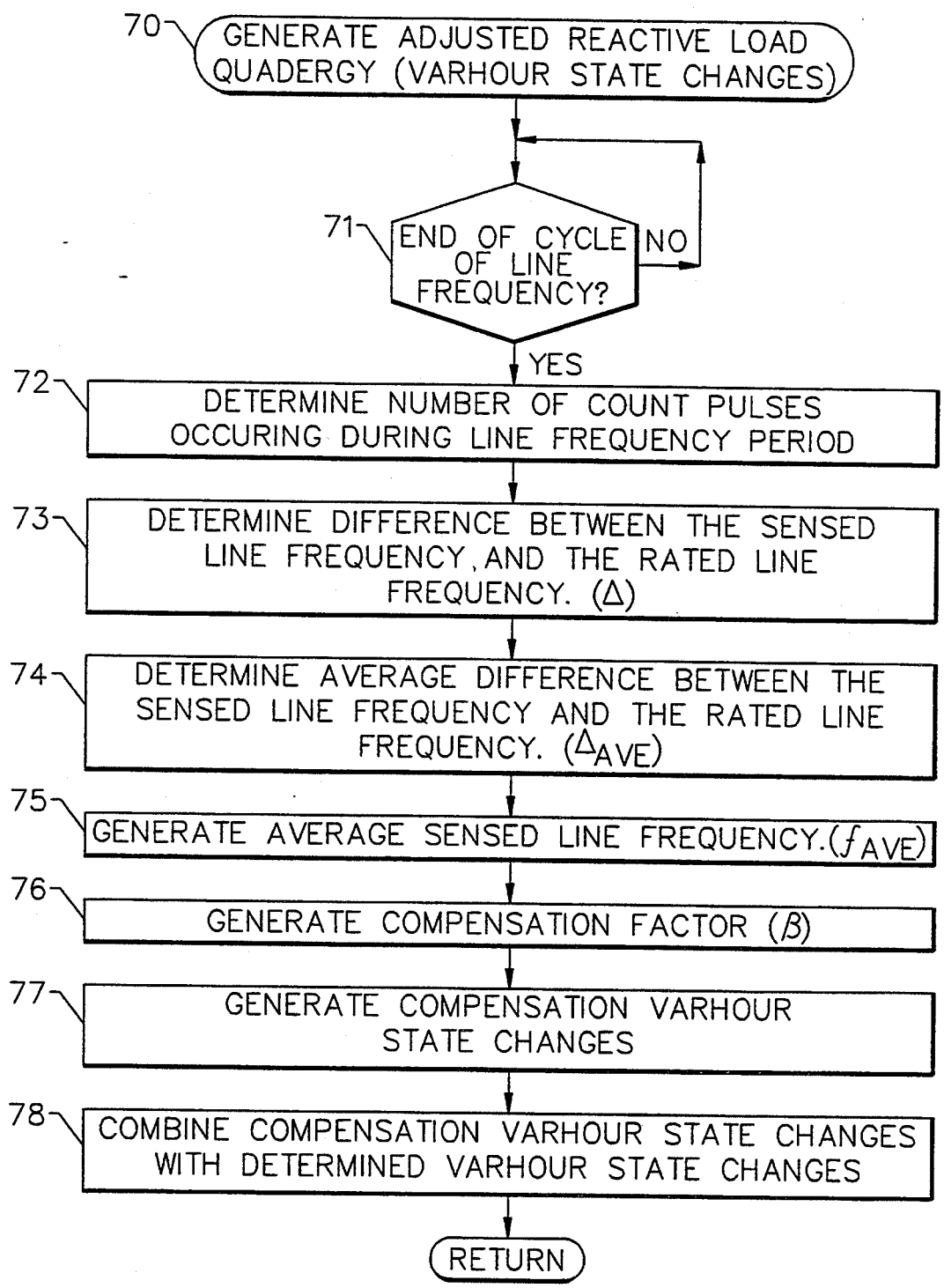
FIG. 4 is a block diagram of operations for generating adjusted varhours according to the present invention.

Referring now to FIG. 4, operation 70 (FIG. 3) for generating adjusted varhour state changes will be described. In particular, the operation begins with a determination 71 of whether the end of a cycle of the sensed line frequency has been encountered. If the operation is to be performed in real-time, i.e., on a cycle by cycle basis, the duration of each cycle represents the length of the energy measurement time interval upon which the adjusted varhours are determined. If the end of the cycle has been encountered, a determination 72 of the number of count pulses occurring during the energy measurement time interval is made and a determination 73 of the difference ($\Delta$) between the sensed line frequency (for the corresponding energy measurement time interval) and the rated line frequency is made.

In the preferred embodiment, a timing oscillator 41 having a 7.3728 Mhz crystal is used to generate a continuous series of count pulses and generate LFOUT', corresponding to the rated line frequency. These count pulses preferably have a rate of 1/12th the rate of the crystal (i.e., 614,400 count pulses/sec). Accordingly, if the sensed frequency is equivalent to a rated frequency of 50 Hz. (60 Hz), 12,288 (10,240) count pulses will be generated during the course of one cycle of the sensed line frequency. If the sensed line frequency is higher than 50 Hz, a lesser number of count pulses will occur during one period, and vice versa. As will be understood by one skilled in the art, by determining the actual number of count pulses occurring during one cycle of the sensed line frequency under measurement (Block 72), the difference between the sensed line frequency and the rated line frequency (Block 73) can be determined. Preferably, this difference is stored as a delta [$\Delta = 12,288 - \#$ of count pulses/measured cycle]. According to an aspect of the present invention, it has been found that sufficient accuracy can be achieved by determining the difference between the sensed line frequency and the rated line frequency for every other cycle of the sensed line frequency, instead of every cycle.

Then, at Block 74, the average difference ($\Delta_{ave}$) between the sensed line frequency and the rated line frequency is determined. A moving average delta, based on sixteen (16) samples is preferably computed according to the following relation where (n) denotes the line frequency cycle under measurement:

$$\Delta_{ave} = \left[ \frac{\left( \Delta_n + \sum_{n-17}^{n-1} \Delta_n - \frac{\sum_{n-17}^{n-1} \Delta_n}{16} \right)}{16} \right] \quad (1)$$

As provided by Equation (1), the moving average difference is determined by first determining the summation of the sixteen previously determined deltas, then subtracting away the average of the sixteen deltas from the summation. Next, the delta for the line frequency cycle under measurement is added and an updated average delta is determined. Preferably, a range of 8-32 samples may be used, with 16 samples being the most preferred. It is expected that the range will vary depending on the rated value of the meter and the load conditions. As will be understood by one skilled in the art, the larger the number of samples used to determined an average, the less robust the compensating means will be at detecting relatively short duration frequency variations. However, if the number is too small, the compensation means will perform unnecessarily frequent and inconsequential adjustments to the determined reactive load quadergy, which may be below the resolution of the hardware used to implement the compensation technique.

Alternatively, the determination 74 of the average difference ($\Delta_{ave}$) can be performed in batch by taking the average of the differences determined during consecutive energy measurement time intervals in a compensation measurement time interval. Accordingly, the average difference between the sensed line frequency and the rated line frequency is determined only once during the compensation measurement time interval.

Next, operation 75 for generating an average sensed line frequency ($f_{ave}$) is performed, based on the determined average difference between the sensed line frequency and the rated line frequency ($f_{rated}$). Based on the average sensed line frequency $f_{ave}$, operation 76 is performed to generate a compensation factor ($\beta$) according to the following relation:

$$\beta = \frac{\pi}{2} \left[ f_{ave} \left( \frac{1}{f_{rated}} - \frac{1}{f_{ave}} \right) \right] \quad (2)$$

The operation 76 for determining $\beta$ is followed by operation 77 for generating compensation varhour state changes, based on $\beta$ and the determined watthours state changes (W) that have been accumulated during the particular energy measurement time interval. If, however, the deltas are computed for every other cycle of the line frequency, as noted above, each generated $\beta$ will be used for two consecutive cycles of the line frequency. Finally, operation 78 is performed for combining the compensation varhour state changes with determined varhour state changes ($V_c$) to thereby generate adjusted varhour state changes ($V_{adj}$) for the particular energy measurement time interval, according to the following relation:

$$V_{adj} = \frac{V_c + \sin \beta W}{\cos \beta} \quad (3)$$

However, for small values of $\beta$, $\sin \beta \simeq \beta$ (in radians) and $\cos \beta \simeq 1$. Accordingly, Equation (3) can be expressed in approximate form as follows:

$$V_{adj} = V_c + \beta W \quad (4)$$

As will be understood by one skilled in the art, the compensation varhour state changes ($\beta W$) will be represented by an operand typically having an integer amount within the range $(-1, 0, 1)$ and a decimal remainder. The decimal remainder is retained for the next performance of operation 70 for generating adjusted varhour state changes.

Referring again to FIG. 3, at the occurrence of an interrupt signal being generated by the microcontroller 45, operations 91 and 92 for detecting the presence of a varhour state change ($V_c$) and accumulating the state change, are performed. Next, operation 80 for checking the varhour state change and outputting a forward direction (lagging) or reverse direction (leading) state change to the register 50 is performed. If the sensed line frequency is equivalent to the rated line frequency, the adjusted pulse trains (VH2', VH1') should be identical to the determined pulse trains (VH2, VH1). As shown by Equation (4), if the number of compensation state changes is positive, extra state changes will be output. If, however, the compensation state changes are negative, the problem is more complex. The compensation state changes may be negative because the number of lagging output varhour state changes should be reduced or because a greater number of leading varhour state changes should be added to the (VH2', VH1') pulse train. To prevent leading varhours from being output when only a reduction in lagging varhours was required, and vice versa, operation 80 is provided.

Figure 5:
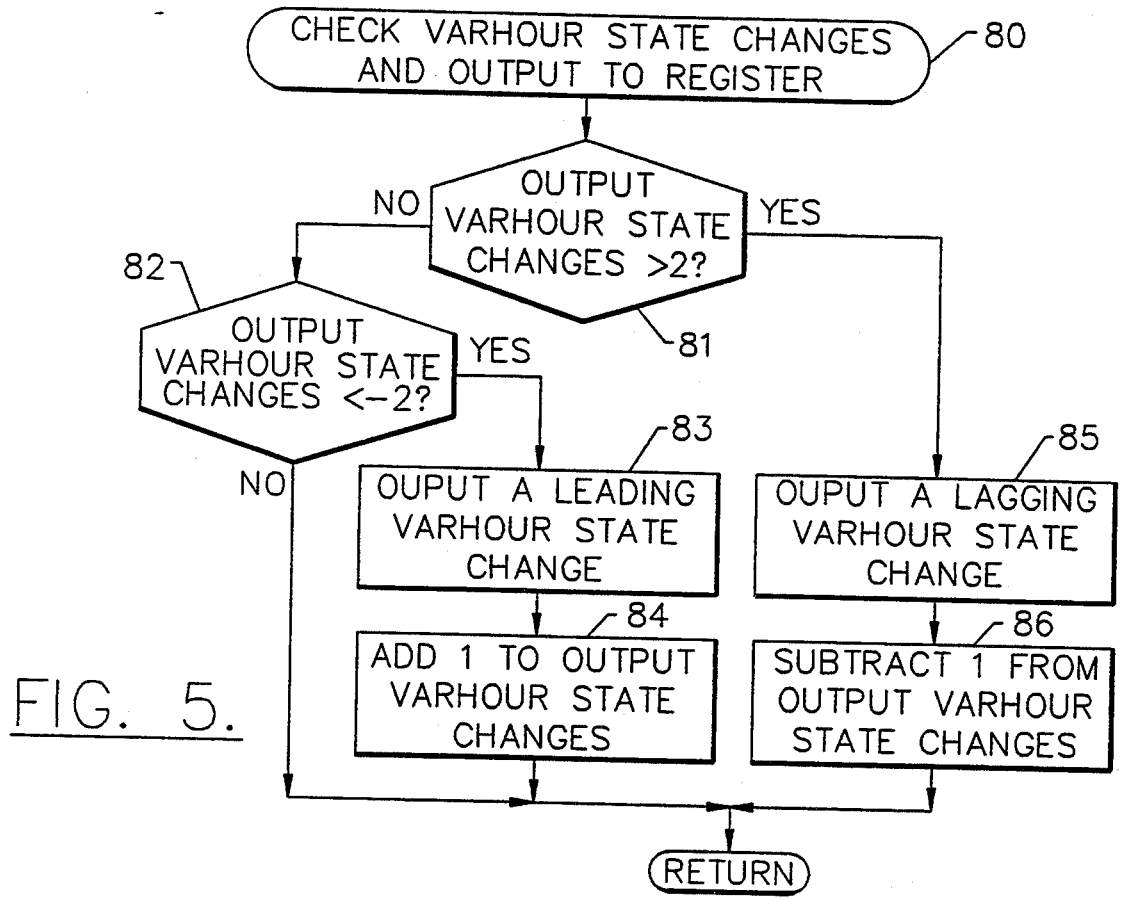
FIG. 5 is a block diagram of operations for outputting varhour state changes to a register according to the present invention.

Referring now to FIG. 5, details of operation 80 for checking the presence of varhour state changes will be described. First, operations 81, 82 are performed to determine whether the number of varhour state changes ($N_{sc}$), accumulated from previous energy measurement time intervals, is within the range $(-2 < N_{sc} < 2)$. The range $-2$ to $2$ is preferred over the range $-1$ to $1$, because it provides for greater hysteresis. If so, the varhour state changes are retained for the next energy measurement time interval and next operation 80. However, if $N_{sc} > 2$, indicating the presence of a net inductive load having a lagging power factor, operation 85 will be performed to output the next forward state change to the register 50. Operation 86 is also performed to decrement $N_{sc}$ accordingly. On the other hand, if $N_{sc} < -2$, indicating the presence of a net capacitive load having a leading power factor, operation 83 will be performed to output the next reverse state change to the register 50. Operation 84 is thereafter performed to increment $N_{sc}$ accordingly.

As will be understood by one skilled in the art, by performing operation 80, the accumulation of a $-1$ state change for a lagging load (or $+1$ for a capacitive load) will cause $N_{sc}$ to fall within the range $-2 < N_{sc} < 2$. Accordingly, for a lagging power factor, compensation involving the removal of a state change from the pulse train (VH2, VH1) is performed by decrementing $N_{sc}$ to within the range so that the next forward state change on (VH2, VH1) will be withheld from (VH2', VH1'). For a leading power factor, compensation involving the removal of a state change from the pulse train (VH2, VH1) is performed by incrementing $N_{sc}$ to within the range so that the next reverse state change on (VH2, VH1) will be withheld from (VH2', VH1'). Thus, for either case, downward compensation is performed by withholding the next forward (or reverse) state change rather than outputting a reverse (or forward) state change as the compensation state change.

Accordingly, the determined varhour state changes (VH2, VH1) can be adjusted by first measuring the difference between the sensed and the rated line frequency and then using that difference to generate a compensation reactive load quadergy in the form of compensation varhour state changes. These compensation varhour state changes are then combined with the determined varhour state changes to thereby generate a varhour pulse train which more accurately reflects the actual reactive load quadergy.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A meter for measuring electrical energy, comprising:
   means for sensing a line voltage, a load current and a line frequency, during an energy measurement time interval;
   means, electrically connected to said sensing means, for determining real load energy from the sensed line voltage and the sensed load current, during the energy measurement time interval;
   means, electrically connected to said sensing means, for determining reactive load quadergy from the sensed line voltage and the sensed load current, during the energy measurement time interval; and
   compensation means, connected to said real load energy determining means and said reactive load quadergy determining means, for adjusting the determined reactive load quadergy, based upon deviations between the sensed line frequency and a rated line frequency.

2. The meter of claim 1, further comprising:
   register means, connected to said real load energy determining means and said compensation means, for determining load energy during a measurement period including the energy measurement time interval.

3. The meter of claim 1, wherein said compensation means comprises:
   means for determining a compensation factor based upon deviations between the sensed line frequency and the rated line frequency;
   means for combining the compensation factor with the determined real load energy to generate a compensation reactive load quadergy; and
   means for combining the determined reactive load quadergy with the compensation reactive load quadergy to thereby generate an adjusted reactive load quadergy.

4. The meter of claim 3, wherein said compensation factor determining means comprises:
   means for determining a difference between the sensed line frequency and the rated line frequency during the energy measurement time interval;

means for determining an average difference between the sensed line frequency and the rated line frequency, based upon the difference determined during the energy measurement time interval and based upon differences determined during preceding energy measurement time intervals; and means for generating a compensation factor, based upon the average difference between the sensed line frequency and the rated line frequency.

5. The meter of claim 4, wherein said means for determining a difference between the sensed line frequency and the rated line frequency during the energy measurement time interval comprises:

means for generating a series of count pulses at a rate proportional to the rated line frequency; and means for determining a number of count pulses occurring during an interval proportional to the period of a cycle of the sensed line frequency, during the energy measurement time interval.

6. The meter of claim 1, wherein said compensation means comprises:

means for generating a series of count pulses at a rate proportional to the rated line frequency;

means for determining a number of count pulses occurring during an interval proportional to the period of a cycle of the sensed line frequency, during the energy measurement time interval;

means for determining a moving average difference between the sensed line frequency and the rated line frequency, based upon the number of count pulses determined during the energy measurement time interval and based upon the number of count pulses determined during preceding energy measurement time intervals;

means for generating a compensation factor, based upon the moving average difference between the sensed line frequency and the rated line frequency;

means for combining the compensation factor with the determined real load energy to generate a compensation reactive load quadergy; and means for combining the determined reactive load quadergy with the compensation reactive load quadergy to thereby generate an adjusted reactive load quadergy.

7. The meter of claim 1, wherein said means for determining reactive load quadergy comprises:

means for quadrature phase shifting the sensed line voltage with respect to the sensed load current.

8. The meter of claim 1, wherein said compensation means comprises:

means for determining a compensation factor based upon deviations between the sensed line frequency and the rated line frequency, during a compensation measurement time interval containing a plurality of energy measurement time intervals;

means for determining an accumulated real load energy from the determined real load energy, during the compensation measurement time interval; and means for combining the compensation factor with the accumulated real load energy to generate a compensation reactive load quadergy, during the compensation measurement time interval.

9. The meter of claim 8, wherein said compensation factor determining means comprises:

means for determining a difference between the sensed line frequency and the rated line frequency during the energy measurement time intervals in the compensation measurement time interval;

means for determining an average difference between the sensed line frequency and the rated line frequency, based upon the differences determined during the energy measurement time intervals in the compensation measurement time interval; and means for generating a compensation factor, based upon the average difference between the sensed line frequency and the rated line frequency.

10. The meter of claim 9, wherein the energy measurement time interval is the period of one cycle of the sensed line frequency, and wherein said compensation measurement time interval is the sum of the periods of a plurality of consecutive cycles of the sensed line frequency.

11. A meter for measuring electrical energy, comprising:

means for sensing a line voltage, a load current and a line frequency, during an energy measurement time interval;

means, electrically connected to said sensing means, for determining the magnitude and sign of real load energy from the sensed line voltage and the sensed load current, during the energy measurement time interval;

means, electrically connected to said sensing means, for determining the magnitude of reactive load quadergy and power factor, from the sensed line voltage and the sensed load current, during the energy measurement time interval; and compensation means, connected to said real load energy magnitude and sign determining means and said reactive load quadergy magnitude and power factor determining means, for adjusting the determined magnitude of the reactive load quadergy, based upon deviations between the sensed line frequency and a rated line frequency.

12. The meter of claim 11, further comprising:

register means, connected to said real load energy magnitude and sign determining means and said compensation means, for determining load energy during a measurement period including the energy measurement time interval.

13. The meter of claim 11, wherein said compensation means comprises:

means for determining a compensation factor based upon deviations between the sensed line frequency and the rated line frequency;

means for combining the compensation factor with the determined magnitude of real load energy to generate a compensation reactive load quadergy; and means for combining the determined magnitude of reactive load quadergy with the compensation reactive load quadergy to thereby generate an adjusted reactive load quadergy.

14. The meter of claim 13, wherein said compensation factor determining means comprises:

means for determining a difference between the sensed line frequency and the rated line frequency during the energy measurement time interval;

means for determining an average difference between the sensed line frequency and the rated line frequency, based upon the difference determined during the energy measurement time interval and based upon differences determined during preceding energy measurement time intervals; and means for generating a compensation factor, based upon the average difference between the sensed line frequency and the rated line frequency.

15. The meter of claim 14, wherein said means for determining a difference between the sensed line frequency and the rated line frequency during the energy measurement time interval comprises:

means for generating a series of count pulses at a rate proportional to the rated line frequency; and means for determining a number of count pulses occurring during an interval proportional to the period of a cycle of the sensed line frequency, during the energy measurement time interval.

16. The meter of claim 11, wherein said compensation means comprises:

means for generating a series of count pulses at a rate proportional to the rated line frequency;

means for determining a number of count pulses occurring during an interval proportional to the period of a cycle of the sensed line frequency, during the energy measurement time interval;

means for determining a moving average difference between the sensed line frequency and the rated line frequency, based upon the number of count pulses determined during the energy measurement time interval and based upon the number of count pulses determined during preceding energy measurement time intervals;

means for generating a compensation factor, based upon the moving average difference between the sensed line frequency and the rated line frequency;

means for combining the compensation factor with the determined magnitude of real load energy to generate a compensation reactive load quadergy; and means for combining the determined magnitude of reactive load quadergy with the compensation reactive load quadergy to thereby generate an adjusted reactive load quadergy.

17. The meter of claim 11, wherein said means for determining reactive load quadergy comprises:

means for quadrature phase shifting the sensed line voltage with respect to the sensed load current.

18. A meter for measuring electrical energy, comprising:

an electronic meter integrated circuit, responsive to a sensed load current and a sensed line voltage, for generating a plurality of output signals including watthour pulse train signals and varhour pulse train signals;

a frequency compensation integrated circuit, responsive to a sensed line frequency, the watthour pulse train signals and the varhour pulse train signals, for generating compensated varhour pulse train signals, based on differences between the sensed line frequency and a rated line frequency; and a register integrated circuit responsive to the watthour pulse train signals and the compensated varhour pulse train signals, for determining a load energy corresponding to the sensed load current and the sensed line voltage.

19. The meter of claim 18, further comprising a timer, connected to said frequency compensation integrated circuit, for generating a series of count pulses at a rate proportional to the rated line frequency.

20. A method for measuring electrical energy during an energy measurement time interval, comprising the steps of:

sensing a load current, a line voltage and a line frequency from an electrical line connected to a load;

phase shifting the sensed line voltage with respect to the sensed load current;

generating a real load energy value from the sensed line voltage and the sensed load current;

generating a reactive load quadergy value from the sensed load current and the phase shifted line voltage;

determining a difference between the sensed line frequency and the rated line frequency; and adjusting the generated reactive load quadergy value, based on a difference between the sensed line frequency and a rated line frequency.

21. The method of claim 20, wherein said determining step comprises the steps of:

generating a series of count pulses at a rate proportional to the rated line frequency; and determining a difference between a number of count pulses occurring during the period of a cycle of the sensed line frequency and a number of count pulses occurring during the period of a cycle of the rated line frequency.

22. The method of claim 21, wherein said adjusting step comprises the steps of:

generating a compensation factor based on the difference between the number of count pulses occurring during the period of a cycle of the sensed line frequency and a number of count pulses occurring during the period of a cycle of the rated line frequency;

combining the compensation factor with the generated real load energy value to generate a compensation reactive load quadergy value; and combining the compensation reactive load quadergy value with the generated reactive load quadergy value to obtain an adjusted reactive load quadergy value.

23. A method for measuring electrical energy, comprising the steps of:

sensing a line voltage, a load current and a line frequency, during an energy measurement time interval;

determining real load energy from the sensed line voltage and the sensed load current, during the energy measurement time interval;

determining reactive load quadergy from the sensed line voltage and the sensed load current, during the energy measurement time interval; and adjusting the determined reactive load quadergy, based upon deviations between the sensed line frequency and a rated line frequency.

24. The method of claim 23, wherein said adjusting step comprises the steps of:

determining a compensation factor based upon deviations between the sensed line frequency and the rated line frequency;

combining the compensation factor with the determined real load energy to generate a compensation reactive load quadergy; and combining the determined reactive load quadergy with the compensation reactive load quadergy to thereby generate an adjusted reactive load quadergy.

25. The method of claim 24, wherein said compensation factor determining step comprises the steps of:

determining a difference between the sensed line frequency and the rated line frequency during the energy measurement time interval;

determining an average difference between the sensed line frequency and the rated line frequency, based upon the difference determined during the energy measurement time interval and based upon differences determined during preceding energy measurement time intervals; and generating a compensation factor, based upon the average difference between the sensed line frequency and the rated line frequency.

* * * * *

UNITED STATES PATENT AND TRADEMARK OFFICE
CERTIFICATE OF CORRECTION

PATENT NO. :   5,336,991                                        Page 1 of 3
DATED      :   August 9, 1994
INVENTOR(S) :  Atherton et al.

It is certified that error appears in the above-identified patent and that said Letters Patent is hereby corrected as shown below:

On the title page, item [56]:

UNDER "U.S. PATENT DOCUMENTS":

Please add the following:

| | | | |
|---|---|---|---|
| 5,059,896 | 10/1991 | Germer et al. | 324/142 |
| 4,884,021 | 11/1989 | Hammond et al. | 324/142 |
| 4,837,504 | 6/1989 | Baer et al. | 324/142 |
| 4,839,819 | 6/1989 | Begin et al. | 364/483 |
| 4,761,606 | 8/1988 | Germer et al. | 324/142 |
| 4,672,555 | 6/1987 | Hart et al. | 364/483 |
| 4,615,009 | 9/1986 | Battocletti et al. | 364/483 |
| 4,598,248 | 7/1986 | Germer | 324/103 |
| 3,718,860 | 2/1973 | Kwast et al. | 324/142 |

Please also add:

OTHER PUBLICATIONS

Sangamo Energy Management Division, Product Bulletin 10506, ST-Q100 Series, Electronic Meter, Effective Date June, 1987.

Sangamo Energy Management Division, Product Bulletin 10251, ST-Q120 Series, Electronic Meter, Effective Date August, 1987.

Sangamo Electricity Division, KVI Multifunction Meter, Product Bulletin 10532, Effective September, 1989.

Scientific Columbus, JEM3, September, 1989.

UNITED STATES PATENT AND TRADEMARK OFFICE
CERTIFICATE OF CORRECTION

PATENT NO. : 5,336,991
DATED : August 9, 1994
INVENTOR(S) : Atherton et al.

It is certified that error appears in the above-identified patent and that said Letters Patent is hereby corrected as shown below:

Appalachian Technologies Corporation, SSM-50T Four Quadrant, Time-of-Use Precision Meter, October, 1989.

APTECH, Inc., PFM-800 Series Multifunction Meters, January, 1991.

Process Systems, Incorporated, The Quad 4 Solid State Meter Family, May 1991.

Trans Data, Inc., EMS 7000 Electronic Metering System with Demand Register, Publication Date Unknown, this copy obtained on May 14, 1991.

Trans Data, Inc., EMS 96 Electronic Metering System, Publication Date Unknown, this copy obtained on May 14, 1991.

ABB Power T&D Company, Inc., ABB Type E1R Polyphase Solid-State Watthour/Varhour meter, September, 1991.

Schlumberger Industries, Inc., Introducing FULCRUM Commercial/Industrial Meters, March, 1991.

Transmission & Distribution Magazine, May, 1992, "Universal Meter Introduced by ABB Power T&D Company, Inc." p. 16.

Engineering-Presentation to AEIC/EEI Meter and Service Committees, September 24, 1990, pp. 1-6.

UNITED STATES PATENT AND TRADEMARK OFFICE
CERTIFICATE OF CORRECTION

PATENT NO. : 5,336,991
DATED : August 9, 1994
INVENTOR(S) : Atherton et al.

It is certified that error appears in the above-identified patent and that said Letters Patent is hereby corrected as shown below:

In Column 5, line 31, "#" should be -- ≠ --.

Signed and Sealed this

Sixth Day of December, 1994

Attest:

BRUCE LEHMAN

*Attesting Officer*  *Commissioner of Patents and Trademarks*